United States Patent
Halbrock et al.

(10) Patent No.: US 9,812,277 B2
(45) Date of Patent: Nov. 7, 2017

(54) THERMAL FUSE AND PRINTED CIRCUIT BOARD WITH THERMAL FUSE

(71) Applicant: BorgWarner Ludwigsburg GmbH, Ludwigsburg (DE)

(72) Inventors: Bernd Halbrock, Königsbach-Stein (DE); Martin Blanc, Knittlingen (DE)

(73) Assignee: BorgWarner Ludwigsburg GmbH, Ludwigsburg (DE)

( * ) Notice: Subject to any disclaimer, the term of this patent is extended or adjusted under 35 U.S.C. 154(b) by 229 days.

(21) Appl. No.: 14/799,274

(22) Filed: Jul. 14, 2015

(65) Prior Publication Data
US 2016/0020054 A1 Jan. 21, 2016

(30) Foreign Application Priority Data
Jul. 16, 2014 (DE) .................. 10 2014 109 982

(51) Int. Cl.
*H01H 85/02* (2006.01)
*H01H 85/08* (2006.01)
(Continued)

(52) U.S. Cl.
CPC ...... *H01H 85/0241* (2013.01); *H01H 37/761* (2013.01); *H01H 85/08* (2013.01); *H01H 85/36* (2013.01); *H05K 1/18* (2013.01); *H01H 2037/762* (2013.01); *H01H 2085/0266* (2013.01); *H01H 2235/01* (2013.01)

(58) Field of Classification Search
CPC ...... H01H 37/761; H01H 85/20; H01H 85/36; H01H 85/055; H01H 2037/046; H01H 2037/763; H01H 2085/0275; H01H 85/0241; H01H 85/08; H01H 2037/762; H01H 2085/0266; H01H 2235/01; H05K 1/18
USPC .................. 361/103, 104; 337/186; 191/39; 200/193; 310/68; 313/567; 315/74; 335/202; 362/162; 439/680
See application file for complete search history.

(56) References Cited

U.S. PATENT DOCUMENTS 5,418,515 A * 5/1995 Reyes .................. H01H 85/303
                                                    337/206
7,864,024 B2 * 1/2011 Schlenker ........... H01H 37/761
                                                    337/239
(Continued)

FOREIGN PATENT DOCUMENTS

DE    10 2005 014 601 A1    10/2006

*Primary Examiner* — Thienvu Tran
*Assistant Examiner* — Nicolas Bellido
(74) *Attorney, Agent, or Firm* — Bose McKinney & Evans LLP

(57) ABSTRACT

A thermal fuse having a bow, which has a first end with a first soldering surface for soldering to a first contact surface of a printed circuit board and a second end with a second soldering surface for soldering to a second contact surface of the printed circuit board, a tensioning element, which is secured to the bow between the first and the second end and which is designed to press with a preload against the bow and the printed circuit board once the two soldering surfaces and the contact surfaces of a printed circuit board have been soldered, wherein a portion of the bow, between the two ends thereof, has a measuring resistor connected in series to the two soldering surfaces. A printed circuit board having such a thermal fuse is additionally described.

10 Claims, 1 Drawing Sheet

(51) Int. Cl.
  *H01H 85/36*    (2006.01)
  *H05K 1/18*     (2006.01)
  *H01H 37/76*    (2006.01)

(56) References Cited

U.S. PATENT DOCUMENTS

| | | | |
|---|---|---|---|
| 7,969,275 B2 * | 6/2011 | Hartzog | H01H 85/0241 337/159 |
| 2001/0020888 A1 | 9/2001 | Schon et al. | |
| 2011/0050386 A1 | 3/2011 | Schlenker et al. | |
| 2012/0038450 A1 * | 2/2012 | Jung | H01H 85/0052 337/184 |
| 2013/0033355 A1 * | 2/2013 | Meyer | H01H 37/761 337/147 |

* cited by examiner

THERMAL FUSE AND PRINTED CIRCUIT BOARD WITH THERMAL FUSE

RELATED APPLICATIONS

This application claims priority to DE 10 2014 109 982.6, filed Jul. 16, 2014, the entire disclosure of which is hereby incorporated herein by reference in its entirety.

BACKGROUND

The invention relates to a thermal fuse, which permanently interrupts an electrical circuit when a critical threshold temperature is exceeded. More specifically, the invention relates to a thermal fuse with which the critical threshold temperature is predefined by the melting point of a soldered joint.

Thermal fuses are arranged together with other circuit elements on printed circuit boards. Space on printed circuit boards is scarce. This disclosure specifies a way in which space can be saved on a printed circuit board with an improved thermal fuse.

SUMMARY

The present disclosure combines a thermal fuse with a measuring resistor, for example for measuring temperature or current. By integrating a measuring resistor into the thermal fuse, the space required until now on a printed circuit board for the measuring resistor can be used for other circuit elements, or the printed circuit board can be made smaller. The combination of a thermal fuse with a measuring resistor is possible without difficulty, although a minimal electrical resistance is routinely required by conventional thermal fuses so that the intrinsic heating is minimal, and measuring resistors necessarily must have a noticeable electrical resistance.

A fuse according to this disclosure has a bow, which is intended to be soldered via the two ends thereof on contact surfaces of a printed circuit board. A tensioning element is mounted on the bow. When the bow is soldered to a printed circuit board the tensioning element is located between the printed circuit board and the bow. The tensioning element then presses with a preload both against the bow and against the printed circuit board. In the event of overheating the soldered joint between the bow and the printed circuit board becomes soft, such that the tensioning element then lifts the bow, at least at one of the two ends thereof, from the printed circuit board and thus interrupts the electrical circuit.

The bow has, between the two ends thereof, a portion that comprises a measuring resistor. By way of example, the measuring resistor can be electrically conductively connected to two end portions of the bow by soldering or welding. Should the measuring resistor be soldered, the electrical circuit can be interrupted in the event of overheating not only in that the tensioning element lifts at least one of the two soldering surfaces of the bow from the printed circuit board, but also in that pressure of the tensioning element separates the soldered joint between the measuring resistor and at least one end portion of the bow. The measuring resistor, for example, may be a current measuring resistor or a temperature measuring resistor.

Current measuring resistors have an approximately constant electrical resistance over wide temperature ranges. By way of example, alloys containing 50 to 57% by weight Cu and 43 to 45% by weight Ni, which for example are obtainable under the trade name Constantan, and also alloys containing 82 to 84% by weight Cu, 12 to 15% by weight Mn and 2 to 4% by weight Ni, which for example are obtainable under the trade name Manganin, are suitable as material for current measuring resistors.

Temperature measuring resistors exhibit a strong dependency of the electrical resistance on temperature. By way of example, measuring resistors made of platinum or nickel are suitable. The temperature measuring resistor may have a resistance that rises with rising temperature, i.e., may be a PTC resistor, or may have a resistance that decreases with rising temperature, i.e., may be an NTC resistor.

The measuring resistor can be arranged on an electrically insulating carrier, for example a ceramic plate. The resistor can be arranged on the carrier as wire or conductive track, for example. Two end portions of the bow can be secured to the ceramic plate, for example by soldering.

The end portions of the bow can be produced from sheet metal, for example sheet copper, sheet brass or sheet steel.

For soldering, a soft solder may be used. A soft solder material is to be understood, in accordance with conventional technical language use, to be a solder material of which the melting point is less than 450° C. Solder material having a much lower melting point, for example less than 250° C., in particular less than 200° C., is advantageous for some applications. By way of example, tin alloys, in particular tin-lead alloys, for example L-Sn60PbAg, and/or indium alloys are suitable. The critical temperature, at which the fuse interrupts the electrical circuit, can be set by the selection of the solder material.

In accordance with an advantageous refinement of this disclosure, the bow is arranged in a housing that has, on its underside, an opening for the tensioning element. The tensioning element can then exert pressure onto the printed circuit board through this opening. The opening may be formed over a large area, for example in that the entire underside of the housing is open, or may only be large enough for the tensioning element to press onto the printed circuit board through the opening. A housing can prevent the thermal fuse from being cooled by a flow of air, which cooling might delay a trip. In addition, a housing can protect the measuring resistor against damage.

The housing can have inwardly projecting protrusions, on which the tensioning element is supported via an end before the fuse is installed in an electrical circuit. It is thus possible to prevent the tensioning element from pressing against the printed circuit board already as the bow is soldered to the printed circuit board. After the soldering the inwardly projecting protrusions can then be moved away from the tensioning element, for example by deforming the housing temporarily or permanently. The end of the tensioning element then slips off from the inner protrusions, such that the tensioning element presses against the printed circuit board through the opening in the housing. Another possibility of removing the end of the tensioning element from the inwardly projecting protrusions lies in the fact that the tensioning element slips off from the inwardly projecting protrusions as a result of increased pressure on said tensioning element.

By way of example, the housing can be assembled from a housing upper part and a housing lower part, wherein the housing upper part is moved relative to the housing lower part following the soldering of the thermal fuse to a printed circuit board. As a result of this relative movement the housing lower part can be deformed, such that the inwardly projecting protrusions are moved away from the tensioning element and this then presses on the printed circuit board.

The inwardly projecting protrusions can be formed for example as a ledge or lugs.

The thermal fuse can also be designed as a current relay. The current flowing through the bow specifically causes a resistive heating of the bow. If the current exceeds a critical threshold value, this leads to such an intense heating that the soldered joints soften and the tensioning element interrupts the electrical circuit.

BRIEF DESCRIPTION OF THE DRAWINGS

The above-mentioned aspects of exemplary embodiments will become more apparent and will be better understood by reference to the following description of the embodiments taken in conjunction with the accompanying drawings, wherein.

DESCRIPTION

The embodiments described below are not intended to be exhaustive or to limit the invention to the precise forms disclosed in the following detailed description. Rather, the embodiments are chosen and described so that others skilled in the art may appreciate and understand the principles and practices of this disclosure.

Figure 1:
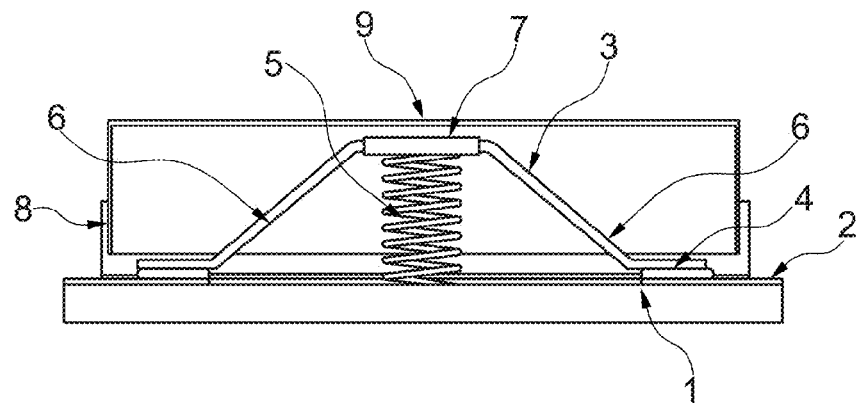
FIG. 1 shows a printed circuit board with a thermal fuse.

FIG. 1 illustrates a printed circuit board 1 that has metallised contact surfaces 2, from which conductive tracks start. A bow 3 has, at both ends thereof, soldering surfaces, which are electrically conductively connected via a solder layer 4 to the two contact surfaces 2. A portion, e.g., a middle portion, of the bow 3 comprises a measuring resistor 7 for measuring current or temperature. The measuring resistor 7 is electrically connected in series to the two end portions 6 of the bow 3, for example is welded or soldered to the end portions 6.

A tensioning element 5, for example a coiled spring, is arranged between the bow 3 and the printed circuit board 1. The tensioning element 5 presses with a preload both against the printed circuit board 1 and against the bow 3. In the event of overheating the solder layer 4 becomes soft, such that the tensioning element 5 can lift an end of the bow 3 from the printed circuit board 1 and can thus interrupt a current flow. The bow 3 and the tensioning element 5 thus form a thermal fuse that interrupts an electrical circuit when a critical threshold temperature is exceeded.

The bow 3 is surrounded by a housing that is assembled from a housing upper part 9 and a housing lower part 8. The housing lower part 8 has, on its underside, an opening through which the tensioning element 5 presses against the printed circuit board 1.

Figure 2:
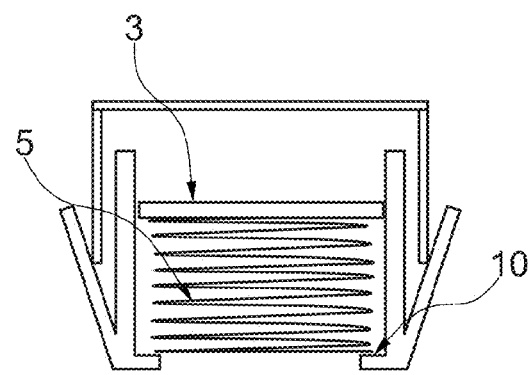
FIG. 2 shows a schematic sectional view of the thermal fuse with detained tensioning element.
Figure 3:
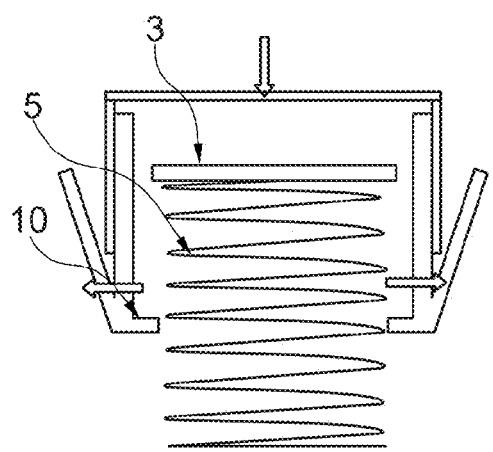
FIG. 3 shows a schematic sectional view of the thermal fuse following release of the detention of the tensioning element.

FIGS. 2 and 3 schematically illustrate a cross section through the housing. Here, FIG. 2 shows the thermal fuse, formed from bow 3 and tensioning element 5, with housing upper part 9 and housing lower part 8 in the production state, prior to the soldering to a printed circuit board 1. In this state the tensioning element 5 is detained by the housing. The tensioning element 5 specifically is supported via one end on inwardly directed protrusions 10 of the lower housing part 8 and presses via its other end against the bow 3. In this state the bow 3 can be soldered to a printed circuit board 1 without pressing the tensioning element 1 against the printed circuit board 1.

Following the soldering the upper housing part 9 presses against the lower housing part 8 in the configuration shown in FIG. 3. The lower housing part 8 thus deforms such that the distance between opposed inwardly directed protrusions 10 enlarges and then the end of the tensioning element 5 previously resting on the protrusions 10 exits through an opening in the housing lower part 8 and can now press against a printed circuit board 1. A deformation of the lower housing part 8 in order to release a detention of the tensioning element 5 can be produced for example in that the upper housing part 9 presses against an inclined surface of the lower housing part 8. Because the upper housing part 9 slides downwardly on such an inclined surface, the opposed walls of the housing lower part 8 are pushed away from one another. The distance between opposed protrusions 10 thus enlarges, such that the lower end of the tensioning element 5 can slip off from the protrusions 10 and can exit from the housing.

While exemplary embodiments have been disclosed hereinabove, the present invention is not limited to the disclosed embodiments. Instead, this application is intended to cover any variations, uses, or adaptations of this disclosure using its general principles. Further, this application is intended to cover such departures from the present disclosure as come within known or customary practice in the art to which this invention pertains and which fall within the limits of the appended claims.

LIST OF REFERENCE SIGNS 1 printed circuit board
2 contact surface of printed circuit board 1
3 bow
4 solder
5 tensioning element
6 end portion of bow 3
7 measuring resistor
8 lower housing part
9 upper housing part
10 protrusion

What is claimed is:

1. A thermal fuse, comprising:
a bow having a first end with a first soldering surface configured for soldering to a first contact surface of a printed circuit board and the bow having a second end with a second soldering surface configured for soldering to a second contact surface of the printed circuit board;
a tensioning element secured to the bow between the first and second ends, the tensioning element configured to press with a preload against the bow and the printed circuit board once the two soldering surfaces and the contact surfaces of the printed circuit board have been soldered;
wherein a portion of the bow between the two ends thereof comprises a measuring resistor connected in series to the two soldering surfaces; and
wherein the bow is arranged in a housing that has, on its underside, an opening through which the tensioning element extends.

2. The thermal fuse according to claim 1, wherein the measuring resistor is a temperature measuring resistor or a current measuring resistor.

3. The thermal fuse according to claim 1, wherein the measuring resistor is arranged on an electrically insulating carrier that is part of the bow.

4. The thermal fuse according to claim 1, wherein the measuring resistor is soldered or welded to two end portions of the bow that comprise the soldering surfaces.

5. The thermal fuse according to claim 4, wherein the two end portions of the bow are made of sheet metal.

6. The thermal fuse according to claim 1, wherein the tensioning element is a coiled spring.

7. A printed circuit board, comprising:
a thermal fuse;
first and second metallized contact surfaces, wherein the thermal fuse electrically conductively connects the two contact surfaces;
conductive tracks starting from the first and second metallized contact surfaces;
the thermal fuse comprising a bow soldered at a first end to the first contact surface and soldered at a second end to the second contact surface; wherein the bow is arranged in a housing that has, on its underside, an opening for a tensioning element;
the tensioning element arranged between the bow and a surface of the printed circuit board, the tensioning element pressing with a preload against the surface of the printed circuit board and the bow, wherein the tensioning element is configured to separate at least one of the two ends of the bow from a respective one of the metallized contact surfaces during overheating; and
a measuring resistor connected in series to the two contact surfaces, wherein the bow is welded or soldered to the measuring resistor and the measuring resistor is positioned between the first and second ends of the bow.

8. The thermal fuse according to claim 7, wherein the housing has a housing upper part and a housing lower part, wherein the housing lower part has inwardly projecting protrusions.

9. The thermal fuse according to claim 8, wherein the housing upper part is connected to the housing lower part such that pressure on the housing upper part moves the inwardly projecting protrusions away from one another, such that the tensioning element is no longer supported on the inwardly projecting protrusions of the housing lower part.

10. A thermal fuse, comprising:
a bow having a first end with a first soldering surface configured for soldering to a first contact surface of a printed circuit board and the bow having a second end with a second soldering surface configured for soldering to a second contact surface of the printed circuit board;
a tensioning element secured to the bow between the first and second ends, the tensioning element configured to press with a preload against the bow and the printed circuit board once the two soldering surfaces and the contact surfaces of the printed circuit board have been soldered;
wherein a portion of the bow between the two ends thereof comprises a measuring resistor connected in series to the two soldering surfaces; and
wherein the measuring resistor is connected to the bow such that pressure from the tensioning element is configured to separate the measuring resistor from the bow in the event of overheating.

* * * * *